United States Patent
Igarashi et al.

(10) Patent No.: US 6,800,804 B2
(45) Date of Patent: Oct. 5, 2004

(54) EPOXY RESIN COMPOSITION USED FOR ENCAPSULATING SEMICONDUCTOR AND SEMICONDUCTOR DEVICE USING THE COMPOSITION

(75) Inventors: Kazumasa Igarashi, Ibaraki (JP); Junichi Toyoda, Tokyo (JP); Katsumi Okayama, Kanagawa (JP)

(73) Assignees: Nitto Denko Corporation, Osaka (JP); Sony Corporation, Tokyo (JP)

( * ) Notice: Subject to any disclaimer, the term of this patent is extended or adjusted under 35 U.S.C. 154(b) by 325 days.

(21) Appl. No.: 10/166,046

(22) Filed: Jun. 11, 2002

(65) Prior Publication Data

US 2003/0024723 A1 Feb. 6, 2003

(30) Foreign Application Priority Data

Jun. 12, 2001 (JP) .................................... P2001-177509

(51) Int. Cl.[7] ................................................ H05K 9/00
(52) U.S. Cl. ................ 174/35 MS; 174/52.2; 252/518.1; 252/511; 428/692
(58) Field of Search .................... 174/35 MS, 35 R, 174/35 GC, 50, 52.1, 52.2, 52.3, 52.4; 428/688, 689, 692; 252/518.1, 511, 513

(56) References Cited

U.S. PATENT DOCUMENTS

| | | | |
|---|---|---|---|
| 5,047,260 A | * | 9/1991 | Durand ....................... 427/508 |
| 5,240,627 A | | 8/1993 | Mohri et al. |
| 5,763,540 A | | 6/1998 | Nakata et al. |
| 6,695,985 B2 | * | 2/2004 | Igarashi et al. .......... 252/518.1 |
| 2002/0039667 A1 | * | 4/2002 | Takaya et al. .............. 428/692 |

FOREIGN PATENT DOCUMENTS

| | | | |
|---|---|---|---|
| EP | 0 281 295 A2 | 9/1988 | |
| EP | 0 468 449 A1 | 1/1992 | |
| GB | 999389 | 7/1965 | |
| JP | 3-23654 | 1/1991 | |
| JP | 4-94501 | 3/1992 | |
| JP | 5-129476 | 5/1993 | |
| JP | 2000228598 A | * 8/2000 | ............ H05K/9/00 |

* cited by examiner

Primary Examiner—Chau N. Nguyen
Assistant Examiner—Carmelo Oliva
(74) Attorney, Agent, or Firm—Sughrue Mion, PLLC

(57) ABSTRACT

A semiconductor element is mounted on a wiring circuit board in which a circuit has been formed. This semiconductor element is resin-encapsulated with a first encapsulating resin layer. Then, a second encapsulating resin layer is formed, on the outer circumference of the first encapsulating resin layer, from an epoxy resin composition containing the following components (A) to (D): (A) epoxy resin; (B) phenolic resin; (C) curing accelerator; and (D) at least one of the following particles (d1) and (d2):

(d1) conductive particles whose surfaces are subjected to coating treatment with an insulating inorganic material; and (d2) magnetic particles whose surfaces are subjected to coating treatment with an insulating inorganic material.

16 Claims, 1 Drawing Sheet

EPOXY RESIN COMPOSITION USED FOR ENCAPSULATING SEMICONDUCTOR AND SEMICONDUCTOR DEVICE USING THE COMPOSITION

The present application is based on Japanese Patent Application No. 2001-177509, which is incorporated herein by reference.

BACKGROUND OF THE INVENTION

1. Field of the Invention

The present invention relates to a semiconductor device resin-encapsulated with a cured resin piece having adequate electric insulation properties and an electromagnetic wave shielding function, and an epoxy resin composition used for encapsulating a semiconductor in the semiconductor device.

2. Description of the Related Art

Generally, the problem of EMC (Electro-Magnetic Compatibility) has been obvious in electric equipment. Measures against the problem have been taken from the two perspectives: emission of unnecessary electromagnetic waves and durability. In recent years, with the advance of miniaturization and higher functions of information communication equipment, semiconductor elements have a tendency to further increase their operating frequencies in order to have higher performance. Particularly with digital signals processed at a higher rate, amplitude values of the signals become lower in order to reduce power consumption. Thus, there is increasing a risk that even weak radio-frequency noise causes a malfunction.

Covering of a semiconductor package with a metal cap has been heretofore carried out as one measure against this risk. However, since an extra mounting space is required, the mounting density of electronic parts cannot increase satisfactorily. Accordingly, other solutions have been under investigation. Nowadays, from such a background, an electromagnetic wave shielding technique suitable for high-density mounting is demanded. If an epoxy resin composition itself used as a encapsulating material has an electromagnetic wave shielding function, electronic parts can be mounted at a high density. Therefore, investigations have been made chiefly into the addition of the electromagnetic wave shielding function to the epoxy resin composition. However, any related-art cured piece made of an epoxy resin composition in which inorganic filler chiefly composed of silica powder has been mixed and dispersed has no electromagnetic wave shielding function at all.

From such a point of view, for example, as a technique for adding an electromagnetic wave shielding function directly to an encapsulating resin material for encapsulating a semiconductor element, a resin-encapsulated semiconductor device having a double-layer structure of encapsulating resin layers has been proposed as disclosed in Unexamined Japanese Patent Publication Hei. 3-23654. One of the encapsulating resin layers is a encapsulating resin layer in which the outside portion of a semiconductor package is encapsulated with resin in which ferromagnetic particles has been dispersed, and the other is an encapsulating resin layer in which the inside portion of the semiconductor package is encapsulated with related-art insulating encapsulating resin. Thus, there is disclosed a technique which can prevent malfunction of a semiconductor element from occurring due to electromagnetic noise. However, some resin in which ferrite or the like has been mixed and dispersed is often inferior in electric insulation properties due to its insufficient specific resistance. Thus, there has been a fear that a leakage current is increased when resin encapsulating is performed between wires or over parts of leads.

On the other hand, similarly to the semiconductor device, another resin-encapsulated semiconductor device is disclosed in Unexamined Japanese Patent Publication No. Hei. 5-129476. That is, this resin-encapsulated semiconductor device has a double-layer structure of encapsulating resin layers, one of which is an encapsulating resin layer for encapsulating the outside portion of the semiconductor package with an encapsulating material mixed with a radio wave absorbing material for shielding from electromagnetic waves, while the other is an encapsulating resin layer for encapsulating the inside portion with related-art insulating encapsulating resin. In this semiconductor device, resin-encapsulating using an encapsulating material mixed with radio wave absorber particles coated with resin or rubber whose melting point is not lower than the melting point of the encapsulating material is proposed as a measure against leakage among pins of lead frames or among wirings of a printed board. However, because of coating with an organic material such as resin or rubber in such a manner, there has been a problem that the hardness is so low that sufficient electric insulation properties are hardly kept under high mechanical shearing in a melt kneading process of the encapsulating material.

SUMMARY OF THE INVENTION

The invention was developed in consideration of such circumferences. An object of the invention is to provide a semiconductor device resin-encapsulated with an encapsulating material superior in electric insulation properties so as to have an electromagnetic wave shielding function, and an epoxy resin composition used for encapsulating a semiconductor in the semiconductor device.

In order to attain the foregoing object, an epoxy resin composition according to a first gist of the invention, as a material for forming a second encapsulating resin layer is to be formed on an outer circumference of a first encapsulating resin layer for encapsulating a semiconductor element, and the epoxy resin composition contains the following components (A) to (D):

(A) epoxy resin;
(B) phenolic resin;
(C) curing accelerator; and
(D) at least one of the following particles (d1) and (d2):
   (d1) conductive particles whose surfaces are subjected to coating treatment with an insulating inorganic material; and
   (d2) magnetic particles whose surfaces are subjected to coating treatment with an insulating inorganic material.

In addition, a semiconductor device according to a second gist of the invention comprises a semiconductor element; a first encapsulating resin layer for encapsulating the semiconductor element; and the second encapsulating resin layer being made of the aforementioned epoxy resin composition and being formed on the outer circumference of the first encapsulating resin layer.

That is, in order to obtain a resin-encapsulated semiconductor device superior in electromagnetic wave shielding function, the inventor et al. conducted a series of investigations chiefly into compounding materials of an epoxy resin composition which is used for the resin encapsulating and which is superior in electric insulation properties. As a result, the inventor et al. found that not only an electromagnetic wave shielding function but also electric insulation properties were improved conspicuously when a semiconductor element is resin-encapsulated with encapsulating resin layers in a double-layer structure, and special conjugated inorganic particles [component (D)] obtained by coating the surfaces of conductive particles or magnetic particles with an insulating inorganic material are used as a material for forming the second encapsulating resin layer of the double-layer structure disposed in the outside portion. Thus, the inventor et al. achieved the invention.

Features and advantages of the invention will be evident from the following detailed description of the preferred embodiments described in conjunction with the attached drawings.

DETAILED DESCRIPTION OF THE PREFERRED EMBODIMENTS

Figure 1:
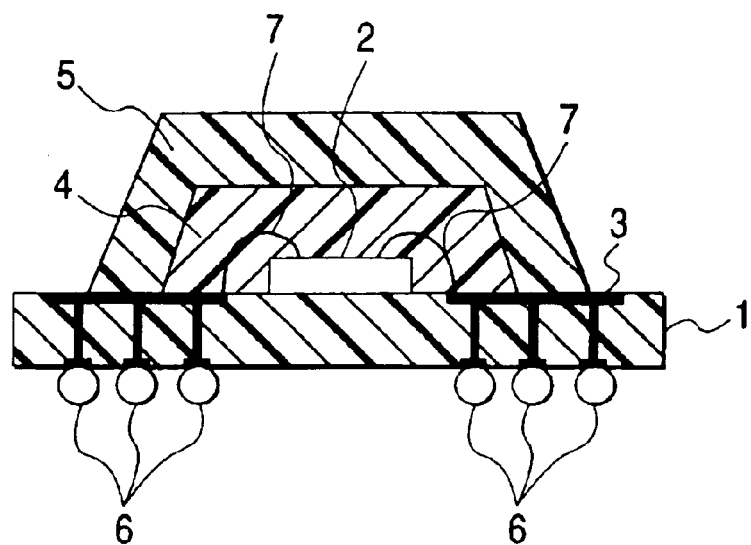
FIG. 1 is a sectional view showing an embodiment of a semiconductor device according to the invention.

Next, description will be made in detail about an embodiment of the invention.

A semiconductor device according to the invention has a semiconductor element resin-encapsulated with a double-layer structure of encapsulating resin layers in which a second encapsulating resin layer is formed on the outer circumference of a first encapsulating resin layer. The second encapsulating resin layer is formed from a specific epoxy resin composition.

The specific epoxy resin composition for forming the second encapsulating resin layer is obtained by use of epoxy resin (component A), phenolic resin (component B), curing accelerator (component C), and special conjugated inorganic particles (component D). The epoxy resin composition is normally formed into powder after melting and mixing of the resin composition or a tablet obtained by compressing the powder.

The epoxy resin (component A) is not limited specifically. Any epoxy resin known heretofore may be used if it exhibits solidity at room temperature (25° C.). Examples of the epoxy resin include biphenyl type epoxy resin, phenol novolac type epoxy resin, and cresol novolac type epoxy resin. Each of these resins may be used alone. Alternatively, two or more kinds of the resins may be used together.

The phenol resin (component B) used together with the component A is not limited specifically. Any phenol resin known heretofore may be used if it has effect as hardener for the epoxy resin (component A) and exhibits solidity at room temperature (25° C.). Examples of the phenol resin include phenol novolac, cresol novolac, bisphenol A type novolac, naphthol novolac, and phenol aralkyl resin. Each of these resins may be used alone. Alternatively, two or more kinds of the resins may be used together.

The compounding ratio between the epoxy resin (component A) and the phenolic resin (component B) is preferably set so that the ratio of the hydroxyl equivalent weight in the phenolic resin to the epoxy equivalent weight in the epoxy resin is in a range of 0.5–1.6. More preferably, the ratio is set to be in a range of 0.8–1.2.

The curing accelerator (component C) used together with the components A and B is not limited specifically. Any curing accelerator known heretofore may be used. Examples of the curing accelerator include 1,8-diazabicyclo(5.4.0) undec-7-ene, tertiary amines such as triethylene diamine, imidazoles such as 2-methylimidazole, and phosphate-based curing accelerator such as triphenylphosphine or tetraphenylphosphonium tetraphenylborate. Each of these accelerators may be used alone. Alternatively, two or more kinds of the accelerators may be used together.

The content of the curing accelerator (component C) is normally set to be in a range of 0.5–10 parts by weight (hereinafter abbreviated to "parts") per 100 parts of the phenolic resin (component B).

The special conjugated inorganic particles (component D) used together with the components A to C are made of at least one of conductive particles (d1) whose surfaces have been subjected to coating treatment with an insulating inorganic material and magnetic particles (d2) whose surfaces have been subjected to coating treatment with an insulating inorganic material.

Examples of the conductive particles and the magnetic particles (d1 and d2) to be treated with the insulating inorganic material include various kinds of metal powders, alloy powders, or magnetic powders of copper, iron, nickel, gold, silver, aluminum, zinc, stainless steel, hematite ($Fe_2O_3$), magnetite ($Fe_3O_4$), various ferrites expressed by a general formula $MFe_2O_4$ or $MO.nFe_2O_3$ (in both the formulae, M designates a bivalent metal particle, including Mn, Co, Ni, Cu, Zn, Ba, Mg, etc; on the other hand, n designates a positive number; and further, as the particles M, the same kind of particles or different kinds of particles may be repeated), silicon steel powder, permalloy, Co-group amorphous alloy, sendust, alperm, supermalloy, Mu-metal, permendur, and perminvar. Each of these powders may be used alone. Alternatively, two or more kinds of the powders may be used together.

It is preferable that particles whose maximum particle size is not larger than 200 $\mu$m and whose average particle size is in a range of 0.5–50 $\mu$m are used as the conductive particles and the magnetic particles. The average particle size is especially preferably in a range of 2–30 $\mu$m. The maximum particle size and the average particle size can be, for example, measured with a laser diffraction/scattering type particle size distribution measuring apparatus.

The insulating inorganic material used in the surface treatment for the conductive particles and the magnetic particles has electric insulation properties. Examples of the insulating inorganic material include silica fine powder, alumina fine powder, etc. Especially, the silica fine powder is used preferably. Of the silica fine powder, spherical silica fine powder, triturated silica fine powder, and granular type silica fine powder are preferable. In addition, from the point of view of fine particle size, the silica fine powder whose average primary particle size is 1–1,000 nm is preferably used. Especially, the silica fine powder whose average primary particle size is 10–500 nm is preferable.

The special conjugated inorganic particles (component D) composed of the conductive particles (d1) whose surfaces have been subjected to coating treatment with the insulating inorganic material and/or the magnetic particles (d2) whose surfaces have been subjected to coating treatment with the insulating inorganic material can be, for example, produced in the following manner. That is, at least one of the conductive particles and the magnetic particles, and the insulating inorganic material are thrown into a surface treatment apparatus having a rotor rotating at high velocity, a stator and a circulating circuit. A conjugating method known heretofore, such as a treatment method in which the particles and the insulating inorganic material repeatedly suffer mechanical actions using mechanical impulsive force such as compression, friction, or shearing is used so that the special conjugated inorganic particles (component D) can be produced. By such a treatment, the surfaces of the conductive particles and/or the magnetic particles are coated with the insulating inorganic material so that the so-called conjugated inorganic particles whose surfaces have been coated with the insulating inorganic material can be obtained.

The content of the special conjugated inorganic particles (component D) is preferably set in a range of 10–90 weight % of the total weight of the epoxy resin composition as the material for forming the second encapsulating resin layer. The content is more preferably 20–85 weight %, and especially more preferably 40–80 weight %. That is, when the content of the special conjugated inorganic particles (component D) is below 10 weight % and too small, the electromagnetic wave shielding effect of the cured piece itself made of the epoxy resin composition as the material for forming the second encapsulating resin layer becomes so insufficient that it becomes difficult to obtain a desired effect. On the contrary, when the content is over 90 weight % and too large, the molten viscosity at the time of low-pressure transfer molding becomes so high that there is seen a tendency that the fluidity deteriorates.

Inorganic filler may be normally used together with the components A to D in the epoxy resin composition as the material for forming the second encapsulating resin layer. The inorganic filler is not limited specifically. Various inorganic fillers known heretofore may be used. Examples of the inorganic fillers include silica powder such as fused silica powder or crystalline silica powder, calcium carbonate powder, titanium white, alumina powder or silicon nitride powder. Each of these fillers may be used alone. Alternatively, two or more kinds of the fillers may be used together. Of these fillers, the silica powder is used preferably because it can reduce the linear expansion coefficient of an obtained cured piece of the epoxy resin composition. Further, of the silica powder, spherical silica powder, triturated fine powder, and granular type silica powder are preferably used. Especially, the spherical fused silica powder is preferably used. In addition, as the inorganic filler, it is preferable to use inorganic filler whose maximum particle size is not larger than 100 μm. Normally, the lower limit of the maximum particle size is about 0.1 μm. Further, in addition to such a maximum particle size, it is preferable to use the inorganic filler whose average particle size is in a range of 1–40 μm. Incidentally, the maximum particle size and the average particle size can be, for example, measured with a laser diffraction/scattering type particle size distribution measuring apparatus in the same manner as those of the conductive particles d1 and the magnetic particles d2.

It is preferable that the content of the inorganic filler is set to be not higher than 50 weight % of the total weight of the epoxy resin composition. The content is more preferably not higher than 30 weight %. That is, when the content of the inorganic filler is above 50 weight % and too large, the molten viscosity of the epoxy resin composition becomes so high that there is seen a tendency that the filling properties deteriorate.

If necessary, additives other than the components A to D and the inorganic filler may be appropriately mixed into the epoxy resin composition as the material for forming the second encapsulating resin layer.

Examples of the additives include a stress reduction agent, pigment, a mold release agent, a coupling agent, and a fire retardant.

Examples of the stress reduction agent include silicone compounds such as side-chain ethylene glycol type dimethylsiloxane, and acrylonitrile-butadiene rubber.

Examples of the pigment include carbon black, and titanium oxide. On the other hand, examples of the mold release agent include polyethylene wax, carnauba wax, and fatty acid salts.

Examples of the coupling agent include silane coupling agents such as γ-glycidoxy propyltrimethoxysilane, and β-(3,4-epoxycyclohexyl)ethyltrimethoxysilane.

An example of the fire retardant includes brominating epoxy resin. In addition thereto, a fire retardant auxiliary such as antimony trioxide is used.

Further, other than the fire retardant, polyhedral conjugated metal hydroxide expressed by the following formula (1) may be used. This metal hydroxide has a polyhedral crystal shape. The metal hydroxide does not have a usual hexagonal lamellar shape or a so-called thin tabular crystal shape such as a flaky shape, but has a granular crystal shape such as an approximately dodecahedral shape, an approximately octahedral shape or an approximately tetrahedral shape, in which the crystal growth is great in the thickness direction (c-axis direction) as well as lengthwise and crosswise, for example, a lamellar crystal has grown in the thickness direction (c-axis direction) so as to be cubed and approximated to a sphere.

Formula 1

$$M_{1-x}Q_x (OH)_2 \quad (1)$$

[In the formula (1), M designates at least one kind of metal atom selected from a group of Mg, Ca, Sn and Ti, and Q designates at least one kind of metal atom selected from a group of Mn, Fe, Co, Ni, Cu and Zn. In addition, x designates a positive number of 0.01–0.5.]

The metal hydroxide having a polyhedral crystal shape can be obtained as follows. That is, crystal growth in the thickness direction (c-axis direction) as well as lengthwise and crosswise is increased, for example, by controlling various conditions in the process for producing metal hydroxide. Thus, metal hydroxide having a desired polyhedral shape such as an approximately dodecahedral shape, an approximately octahedral shape or an approximately tetrahedral shape, can be obtained. Generally, the metal hydroxide is made of a mixture of such metal hydroxides.

Specific prototypes of such metal hydroxides having polyhedral shapes can be expressed by the formula $Mg_{1-x}Ni_x (OH)_2$ [0.01<X<0.5], $Mg_{1-x}Zn_x (OH)_2$ [0.01<X<0.5], and the like. One of examples of commercial products of such metal hydroxides is ECHORMAG made by Tateho Chemical Industries Co., Ltd.

In addition, the aspect ratio of the metal hydroxide having a polyhedral shape is normally 1–8, preferably 1–7, and more preferably 1–4. The aspect ratio here means the ratio of the major axis of the metal hydroxide to the minor axis thereof. That is, when the aspect ratio exceeds 8, an epoxy resin composition containing this metal hydroxide is short of effect on the lowering of viscosity when the epoxy resin composition melts.

For example, the epoxy resin composition as the material for forming the second encapsulating resin layer can be produced as follows. That is, predetermined loadings of epoxy resin (component A), phenolic resin (component B), curing accelerator (component C), special conjugated inorganic particles (component D), and further, if necessary, other additives such as inorganic filler, a stress reduction agent, pigment, a mold release agent, a coupling agent, and a fire retardant are compounded and mixed adequately by melt dispersion by use of a heated roll, an extruder, a kneader or the like. Then, the mixture is cooled and ground. The ground mixture may be compression-molded into a tablet as occasion demands. By such a series of steps, it is possible to produce an aimed epoxy resin composition as the material for forming the second encapsulating resin layer.

On the other hand, for the epoxy resin composition as the material for forming the first resin layer formed on the inner circumference of the second encapsulating resin layer, components similar to those of the epoxy resin composition as the material for forming the second encapsulating resin layer are used except that the special conjugated inorganic particles (component D) used in the material for forming the second encapsulating resin layer is not used. An example of the epoxy resin composition as the material for forming the first resin layer will be described. Similarly to those used in the epoxy resin composition for the second encapsulating resin layer, inorganic filler known heretofore, such as fused silica powder, crystalline silica powder, titanium white, alumina powder or silicon nitride powder; inorganic filler such as magnetic particles of ferrite in a range not to lower the insulation properties; and further, if necessary, other additives such as a stress reduction agent, pigment, a mold release agent, a coupling agent, and a fire retardant such as conjugated metal hydroxide may be mixed appropriately together with the components A to C. Then, in the similar manner to the epoxy resin composition as the material for forming the second encapsulating resin layer, predetermined loadings of such various components are compounded and mixed adequately by melt dispersion by use of a heated roll, an extruder, a kneader or the like. Then, the mixture is cooled and ground. The ground mixture may be compression-molded into a tablet as occasion demands. By such a series of steps, it is possible to produce an aimed epoxy resin composition as the material for forming the first encapsulating resin layer.

Alternatively, liquid epoxy resin composition known heretofore may be used for the epoxy resin composition as the material for forming the first encapsulating resin layer. For example, the liquid epoxy resin composition is a combination of epoxy resin known heretofore, for example, taking on a liquid state at room temperature (25° C.), such as bisphenol-A type epoxy resin or bisphenol-F type epoxy resin, and liquid hardener such as liquid acid anhydride or liquid phenol novolac. If necessary, curing accelerator, and inorganic filler known heretofore, such as fused silica powder, crystalline silica powder, titanium white, alumina powder or silicon nitride powder, may be mixed. Further, if necessary, a stress reduction agent, pigment, a coupling agent, any one fire retardant, etc., may be mixed suitably.

The method of encapsulating a semiconductor element by use of the epoxy resin composition as the material for forming the first encapsulating resin layer and the epoxy resin composition as the material for forming the second encapsulating resin layer obtained thus is not limited specifically. The encapsulating may be carried out by a known molding method such as normal low-pressure transfer molding. To Describe it more in detail, first, a semiconductor element is resin-encapsulated, by low-pressure transfer molding, with the material for forming the first encapsulating resin layer. Next, a second encapsulating resin layer is formed on the outer circumference of the first encapsulating resin layer, by low-pressure transfer molding, from the material for forming the second encapsulating resin layer.

It is preferable that the second encapsulating resin layer of the semiconductor device obtained thus is formed to have a thickness in a range of 0.1–5 mm in consideration of the electromagnetic wave shielding function.

An embodiment of semiconductor devices resin-encapsulated with the first encapsulating resin layer forming material and the second encapsulating resin layer forming material will be shown. FIG. 1 shows a single-side encapsulated semiconductor device, in which a semiconductor element 2 is mounted on a wiring circuit board 1 in which a circuit 3 has been formed. The semiconductor element 2 is resin-encapsulated with a first encapsulating resin layer 4. Then, a second encapsulating resin layer 5 is formed on the outer circumference of the first encapsulating resin layer 4. In FIG. 1, the reference numeral 6 represents a connection electrode portion provided on the back side of the wiring circuit board 1; and 7, a bonding wire for connecting the semiconductor element 2 and the circuit 3.

Figure 2:
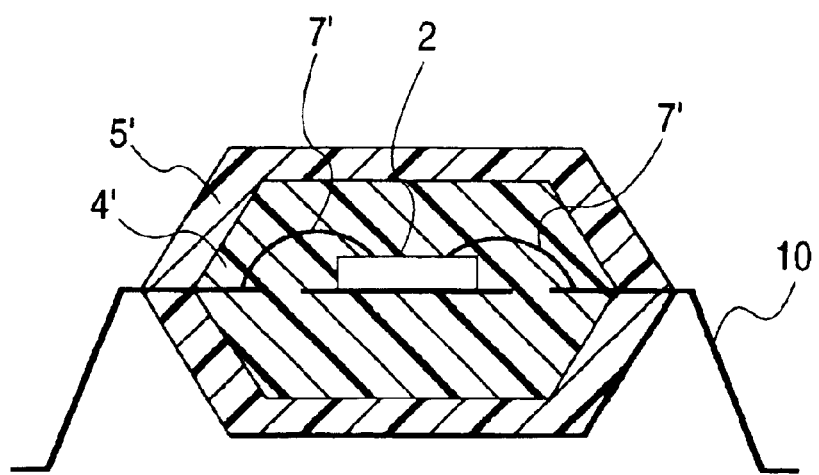
FIG. 2 is a sectional view showing another embodiment of the semiconductor device according to the invention.

Further, FIG. 2 shows another embodiment of a semiconductor device according to the invention. In this semiconductor device, first, a lead frame 10 on which a semiconductor element 2 is mounted is wholly resin-encapsulated with a first encapsulating resin layer 4'. Further, a second encapsulating resin layer 5' is formed on the outer circumference of the first encapsulating resin layer 4'. In FIG. 2, the reference numeral 7' represents a bonding wire for connecting the semiconductor element 2 and the lead frame 10.

Next, description will be made about examples together with comparative examples.

EXAMPLE 1

Epoxy Resin Composition a as Material for Forming Second Encapsulating Resin Layer Mn—Zn-based soft ferrite whose average particle size was 3 μm and spherical silica fine powder whose primary particle size was about 12 nm were prepared. Then, the Mn—Zn-based soft ferrite and the spherical silica fine powder compounded so that the ratio of the latter to the former was 10 parts to 100 parts were thrown into a surface treatment apparatus having a rotor rotating at a high velocity, a stator and a circulating circuit. The surface treatment apparatus was operated for 3 minutes at the rotation speed of 4,800 rpm. Then, conjugated inorganic particles in which the Mn—Zn-based soft ferrite was insulated and coated with the spherical silica fine powder were discharged from this apparatus. Thus, the conjugated inorganic particles were produced.

Next, 419 parts of the conjugated inorganic particles, 100 parts of o-cresol novolac type epoxy resin (epoxy equivalent weight 195, softening point 75° C.), 60 parts of phenol novolac resin hardener (hydroxyl equivalent weight 106, softening point 82° C.), 1 part of triphenylphosphine, 20 parts of brominated phenol novolac type epoxy resin (epoxy equivalent weight 280), 15 parts of antimony trioxide, 2 parts of carbon black, 1 part of silane coupling agent, and 2 parts of polyethylene wax were compounded together, melted and kneaded for 3 minutes by a heated roll heated to 95–100° C., and cooled. Thus, a powdery epoxy resin composition a of 10 mesh passed was obtained.

Epoxy Resin Composition A as Material for Forming First Encapsulating Resin Layer On the other hand, in addition to the epoxy resin composition a, 419 parts of Ni—Zn-based ferrite powder (average particle size 10 μm, maximum particle size 100 μm) were used directly without surface treatment. The other things were set similarly to those in the epoxy resin composition a. Thus, a powdery epoxy resin composition A of 10 mesh passed was obtained.

EXAMPLE 2

Epoxy Resin Composition b as Material for Forming Second Encapsulating Resin Layer Amorphous nickel particles whose average particle size was 10 μm and spherical silica fine powder whose average particle size was 100 nm were prepared. Then, the amorphous nickel particles and the spherical silica fine powder compounded so that the ratio of the latter to the former was 20 parts to 100 parts were thrown into a surface treatment apparatus having a rotor rotating at a high velocity, a stator and a circulating circuit. The surface treatment apparatus was operated for 10 minutes at the rotation speed of 2,600 rpm. Then, conjugated inorganic particles in which the amorphous nickel particles were insulated and coated with the spherical silica fine powder were discharged from this apparatus. Thus, the conjugated inorganic particles were produced.

Next, a powdery epoxy resin composition b as the material for forming the second encapsulating resin layer was obtained in the same manner as in Embodiment 1.

Epoxy Resin Composition B as Material for Forming First Encapsulating Resin Layer 419 parts of spherical fused silica powder (average particle size 20 μm, maximum particle size 128 μm) were used in place of the Ni—Zn-based ferrite powder. The other things were set similarly to those in the epoxy resin composition A in Example 1. Thus, a powdery epoxy resin composition B of 10 mesh passed was obtained.

EXAMPLE 3

Epoxy Resin Composition c as Material for Forming Second Encapsulating Resin Layer The loading of the conjugated inorganic particles was changed to 62 parts, while 357 parts of fused silica powder having an average particle size of 35 μm were used. The other things were set similarly to those in the epoxy resin composition a in Example 1. Thus, an aimed powdery epoxy resin composition c of 10 mesh passed was obtained.

Epoxy Resin Composition for Use as Material for Forming First Encapsulating Resin Layer The epoxy resin composition A produced in Example 1 was used.

EXAMPLE 4

Epoxy Resin Composition d as Material for Forming Second Encapsulating Resin Layer The loading of the conjugated inorganic particles was changed to 1,809 parts. The other things were set similarly to those in the epoxy resin composition a in Example 1. Thus, an aimed powdery epoxy resin composition d of 10 mesh passed was obtained.

Epoxy Resin Composition for Use as Material for Forming First Encapsulating Resin Layer The epoxy resin composition B produced in Example 2 was used.

EXAMPLE 5

Epoxy Resin Composition e as Material for Forming Second Encapsulating Resin Layer Spherical silica fine powder whose primary particle size was about 500 nm was used in place of the spherical silica fine powder whose primary particle size was about 12 μm. The other things were set similarly to those in the epoxy resin composition a in Example 1. Thus, an aimed powdery epoxy resin composition e of 10 mesh passed was obtained.

Epoxy Resin Composition for Use as Material for Forming First Encapsulating Resin Layer The epoxy resin composition B produced in Example 2 was used.

EXAMPLE 6

Epoxy Resin Composition f as Material for Forming Second Encapsulating Resin Layer Spherical silica fine powder whose primary particle size was about 5 nm was used in place of the spherical silica fine powder whose primary particle size was about 12 μm. The other things were set similarly to those in the epoxy resin composition b in Example 2. Thus, an aimed powdery epoxy resin composition f of 10 mesh passed was obtained.

Epoxy Resin Composition for Use as Material for Forming First Encapsulating Resin Layer The epoxy resin composition B produced in Example 2 was used.

COMPARATIVE EXAMPLE 1

The epoxy resin composition B produced in Example 2 was used for both the material for forming the second encapsulating resin layer and the material for forming the first encapsulating resin layer.

COMPARATIVE EXAMPLE 2

Epoxy Resin Composition g as Material for Forming Second Encapsulating Resin Layer The amorphous nickel powder used in the epoxy resin composition b in Example 2 was used directly without surface treatment. The other things were set similarly to those in the epoxy resin composition b in Example 2. Thus, an aimed powdery epoxy resin composition g of 10 mesh passed was obtained.

Epoxy Resin Composition for Use as Material for Forming First Encapsulating Resin Layer The epoxy resin composition B produced in Example 2 was used.

Upon each epoxy resin composition obtained thus, electromagnetic wave shielding properties, volume resistivity, noise radiation level, and a lead-to-lead leakage current were measured according to the following methods respectively. Tables 1 to 4 which will be described later show these results.

Electromagnetic Wave Shielding Properties

Each powdery epoxy resin composition was compressed into a tablet with a diameter of 38 mm. After that, the tablet was molded under the conditions that the molding pressure was 6.86 MPa, the mold temperature was 175° C. and the molding time was 2 minutes. Then, post-hardening was performed at 175° C. for 5 hours so as to produce a lamellar molded product measuring 80 mm by 80 mm by 2 mm in thickness. The obtained lamellar molded product was fixed to a specimen holder between a transmitting antenna and a receiving antenna, and the electromagnetic wave shielding properties were measured in a range up to at a measuring frequency of 1,000 MHz by a spectrum analyzer (generally called TR-17031 method). Then, the shielding properties (electromagnetic wave shielding properties) at 500 MHz were evaluated with respect to an electric field component and a magnetic field component respectively.

Volume Resistivity

By use of each powdery epoxy resin composition, a disc-shaped cured product measuring 3 mm in thickness by 50 mm in diameter was produced in the same manner as in the measurement of the electromagnetic wave shielding properties. Then, silver electrodes were produced by use of silver paste so that the diameter of a main electrode was 30 mm, the diameter of a guard electrode was 32 mm, and the diameter of an opposed electrode was 45 mm. After that, DC voltage of 500 V was applied to the cured product to measure the volume resistivity (based on JIS K 6911).

Noise Radiation Level With Semiconductor Device

As shown in FIG. 1, a CMOS 2 measuring 1.23 mm by 1.18 mm was mounted on an FR-4 resin wiring circuit board 1, and the CMOS 2 and a circuit 3 of the wiring circuit board 1 were electrically connected by gold wires 7. This arrangement was used together with the respective powdery epoxy resin compositions (the first encapsulating resin layer forming material and the second encapsulating resin layer forming material). That is, first, the CMOS 2 was resin-encapsulated with the first encapsulating resin layer forming material A or B by transfer molding (at 175° C. for 2 minutes from injection to molding) so that a first encapsulating resin layer 4 was formed. Next, the second encapsulating resin layer forming material a to g was used to form a second encapsulating resin layer 5 (1 mm thick) on the outer circumference of the first encapsulating resin layer 4 by transfer molding (at 175° C. for 2 minutes from injection to molding). Thus, a ball grid array (BGA) resin-encapsulated package as a resin-encapsulated semiconductor device in which the second encapsulating resin layer 5 was formed on the outer circumference of the first encapsulating resin layer 4 was produced. While the obtained BGA resin-encapsulated package was operated at 20 MHz, scanning at a pitch of 5 mm was carried out 10 mm above the package by use of an electromagnetic wave exploring probe so as to measure noise (in a range of 200–300 MHz) radiated from the package.

Lead-to-Lead Leakage Current

A leakage current value between leads of the double-molded BGA resin-encapsulated package was measured. The symbol "o" was given when the measured leakage current value was less than three times as large as that in the case of the FR-4 resin wiring circuit board alone before molding. On the other hand, the symbol "x" was given when the measured leakage current value was three or more times as large.

TABLE 1

| | | Example | | | |
|---|---|---|---|---|---|
| | | 1 | | 2 | |
| first encapsulating resin layer forming material | | A | — | B | — |
| second encapsulating resin layer forming material | | — | a | — | b |
| electromagnetic wave shielding properties at 500 MHz | electric field component (dB) | −15 | −30 | 0 | −43 |
| | magnetic field component (dB) | −11 | −25 | 0 | −39 |
| volume resistivity (Ω · cm) | | $3.1 \times 10^{13}$ | $2.2 \times 10^{14}$ | $3.8 \times 10^{16}$ | $1.1 \times 10^{13}$ |
| noise radiation level (dBμV) | | 71 | | 72 | |
| Lead-to-lead leakage current | | o | | o | |

TABLE 2

| | | Example | | | |
|---|---|---|---|---|---|
| | | 3 | | 4 | |
| first encapsulating resin layer forming material | | A | — | B | — |
| second encapsulating resin layer forming material | | — | c | — | d |
| electromagnetic wave shielding properties at 500 MHz | electric field component (dB) | −15 | −5 | 0 | −50 |
| | magnetic field component (dB) | −11 | −3 | 0 | −48 |
| volume resistivity (Ω · cm) | | $3.1 \times 10^{13}$ | $3.6 \times 10^{15}$ | $3.8 \times 10^{16}$ | $1.0 \times 10^{15}$ |
| noise radiation level (dBμV) | | 77 | | 70 | |
| Lead-to-lead leakage current | | o | | o | |

TABLE 3

| | | Example | | | |
|---|---|---|---|---|---|
| | | 5 | | 6 | |
| first encapsulating resin layer forming material | | B | — | B | — |
| second encapsulating resin layer forming material | | — | e | — | f |
| electromagnetic wave shielding properties at 500 MHz | electric field component (dB) | 0 | −28 | 0 | −48 |
| | magnetic field component (dB) | 0 | −22 | 0 | −45 |
| volume resistivity (Ω · cm) | | $3.8 \times 10^{16}$ | $5.0 \times 10^{14}$ | $3.8 \times 10^{16}$ | $1.2 \times 10^{13}$ |
| noise radiation level (dBμV) | | 76 | | 71 | |
| Lead-to-lead leakage current | | o | | o | |

TABLE 4

|  |  | Comparative Example | | |
|---|---|---|---|---|---|
|  |  | 1 | | 2 | |
| first encapsulating resin layer forming material | | B | — | B | — |
| second encapsulating resin layer forming material | | — | B | — | g |
| electromagnetic wave shielding properties at 500 MHz | electric field component (dB) | 0 | 0 | 0 | −50 |
| | magnetic field component (dB) | 0 | 0 | 0 | −46 |
| volume resistivity (Ω · cm) | | $3.8 \times 10^{16}$ | $3.8 \times 10^{16}$ | $3.8 \times 10^{16}$ | $6.0 \times 10^{3}$ |
| noise radiation level (dBμV) | | 81 | | 70 | |
| lead-to-lead leakage current | | ○ | | ○ | |

From the results of Tables 1 to 4, the effect of improvement in the values of the electromagnetic wave shielding properties in the products in Examples was obvious in comparison with those in the products in Comparative Examples. Further, it is proved that the products in Examples are also superior in the insulation resistance values.

As described above, a semiconductor device according to the invention is designed so that a semiconductor element is resin-encapsulated with first and second encapsulating resin layers in a double-layer structure in which the second encapsulating resin layer is formed on the outer circumference of the first encapsulating resin layer. The second encapsulating resin layer is formed from an epoxy resin composition containing special conjugated inorganic particles (component D) whose surfaces are subjected to coating treatment with an insulating inorganic material. Accordingly, the second encapsulating resin layer has not only electric insulation properties but also an electromagnetic wave shielding function. Thus, the semiconductor device according to the invention is excellent in EMC.

Thus, the semiconductor device according to the invention is a resin-encapsulated semiconductor device which can cope with the advance of higher frequency in addition to various features belonging to the related art, that is, in addition to excellent reliability, excellent mass productivity and low price.

This invention should not be limited to the embodiments described above. Various modifications can be included in this invention within a range which can be easily realized by those skilled in the art without departing from the spirit of the scope of claim.

What is claimed is:

1. An epoxy resin composition as a material for forming a second encapsulating resin layer to be formed on an outer circumference of a first encapsulating resin layer for encapsulating a semiconductor element, said epoxy resin composition containing the following components (A) to (D):
    (A) epoxy resin;
    (B) phenolic resin;
    (C) curing accelerator; and
    (D) at least one of the following particles (d1) and (d2):
        (d1) conductive particles whose surfaces are subjected to coating treatment with an insulating inorganic material; and
        (d2) magnetic particles whose surfaces are subjected to coating treatment with an insulating inorganic material.

2. An epoxy resin composition according to claim 1, wherein each of said conductive particle and said magnetic particle is selected from a group consisting of copper, iron, nickel, gold, silver, aluminum, zinc, stainless steel, hematite and magnetite.

3. An epoxy resin composition according to claim 1, wherein each of said conductive particle and said magnetic particle is one of $MFe_2O_4$ and $MO \cdot nFe_2O_3$, wherein M designates a bivalent metal particle and n designates a positive number.

4. An epoxy resin composition according to claim 3, wherein M is at least one selected from a group consisting of Mn, Co, Ni, Cu, Zn, Ba and Mg.

5. An epoxy resin composition according to claim 1, wherein each of said conductive particle and said magnetic particle is at least one selected from a group consisting of silicon steel, permalloy, Co-group amorphous alloy, sendust, alperm, supermalloy, Mu-metal, permendur, and perminvar.

6. An epoxy resin composition according to claim 1, wherein a particle size of each of said conductive particle and said magnetic particle is not larger than 200 μm.

7. An epoxy resin composition according to claim 1, wherein said insulating inorganic material is one of silica fine powder and alumina fine powder.

8. An epoxy resin composition according to claim 1, wherein a content of said insulating inorganic particle material is in a range of 10–90 weight % of a total weight of said epoxy resin composition.

9. An epoxy resin composition according to claim 1, further comprising inorganic filler.

10. An epoxy resin composition according to claim 9, wherein said inorganic filler is at least one selected from a group consisting of silica powder, calcium carbonate powder, titanium white, alumina powder and silicon nitride powder.

11. An epoxy resin composition according to claim 9, wherein a particle size of said inorganic filler is not larger than 100 μm.

12. An epoxy resin composition according to claim 9, wherein a content of said inorganic filler is not higher than 50 weight % of a total weight of said epoxy resin composition.

13. An epoxy resin composition according to claim 1, further comprising polyhedral conjugated metal hydroxide expressed by the following formula, $$M_{1-x}Q_x(OH)_2$$

wherein M designates at least one of selected from a group of consisting of Mg, Ca, Sn and Ti, Q designates at least one kind of metal atom selected from a group of Mn, Fe, Co, Ni, Cu and Zn, and x designates a positive number of 0.01–0.5.

14. An epoxy resin composition according to claim 13, wherein said metal hydroxide is one of $Mg_{1-x}Ni_x(OH)_2$ [0.01<X<0.5] and $Mg_{1-x}Zn_x(OH)_2$ [0.01<X<0.5].

15. An epoxy resin composition according to claim 13, wherein an aspect ratio of said metal hydroxide is in a range of 1 to 8.

16. A semiconductor device comprising: a semiconductor element; a first encapsulating resin layer for encapsulating said semiconductor element; and said second encapsulating resin layer according to claim 1 being formed on the outer circumference of said first encapsulating resin layer.

* * * * *